(12) United States Patent
Jachowski

(10) Patent No.: US 11,329,626 B2
(45) Date of Patent: May 10, 2022

(54) BANDPASS FILTER WITH IMPROVED UPPER BAND EDGE SHARPNESS

(71) Applicant: Resonant Inc., Goleta, CA (US)

(72) Inventor: Douglas Jachowski, Santa Cruz, CA (US)

(73) Assignee: Resonant Inc., Austin, TX (US)

( * ) Notice: Subject to any disclaimer, the term of this patent is extended or adjusted under 35 U.S.C. 154(b) by 231 days.

(21) Appl. No.: 16/698,406

(22) Filed: Nov. 27, 2019

(65) Prior Publication Data

US 2020/0177160 A1 Jun. 4, 2020

Related U.S. Application Data

(60) Provisional application No. 62/773,884, filed on Nov. 30, 2018.

(51) Int. Cl.
*H03H 9/54* (2006.01)
*H03H 9/56* (2006.01)

(52) U.S. Cl.
CPC ............ *H03H 9/542* (2013.01); *H03H 9/568* (2013.01)

(58) Field of Classification Search
CPC .......... H03H 9/54; H03H 9/542; H03H 9/568; H03H 9/64; H03H 9/72
See application file for complete search history.

(56) References Cited

U.S. PATENT DOCUMENTS

| | | | |
|---|---|---|---|
| 6,377,140 B1 | 4/2002 | Ehara et al. | |
| 9,118,303 B2 * | 8/2015 | Inoue | H03H 9/6483 |
| 2009/0201104 A1 * | 8/2009 | Ueda | H03H 9/6483 |
| | | | 333/195 |
| 2014/0289692 A1 * | 9/2014 | Fenzi | G06F 30/36 |
| | | | 716/122 |
| 2017/0201235 A1 * | 7/2017 | Freisleben | H03H 9/6483 |
| 2017/0331456 A1 * | 11/2017 | Ono | H03H 9/6483 |
| 2020/0412335 A1 * | 12/2020 | Takata | H03H 9/02559 |

* cited by examiner

*Primary Examiner* — Dean O Takaoka
(74) *Attorney, Agent, or Firm* — Socal IP Law Group LLP; Angelo Gaz

(57) ABSTRACT

Bandpass filters are disclosed. A bandpass filter includes a plurality of series resonators and a plurality of shunt resonators. The series resonators are connected in series between a first port and a second port. The plurality of series resonators includes a first series resonator and a second series resonator connected at a node. The plurality of shunt resonators includes a first shunt resonator coupled between the node and a ground. A capacitor bridges the first and second series resonators.

8 Claims, 6 Drawing Sheets

©2019 RESONANT INC.

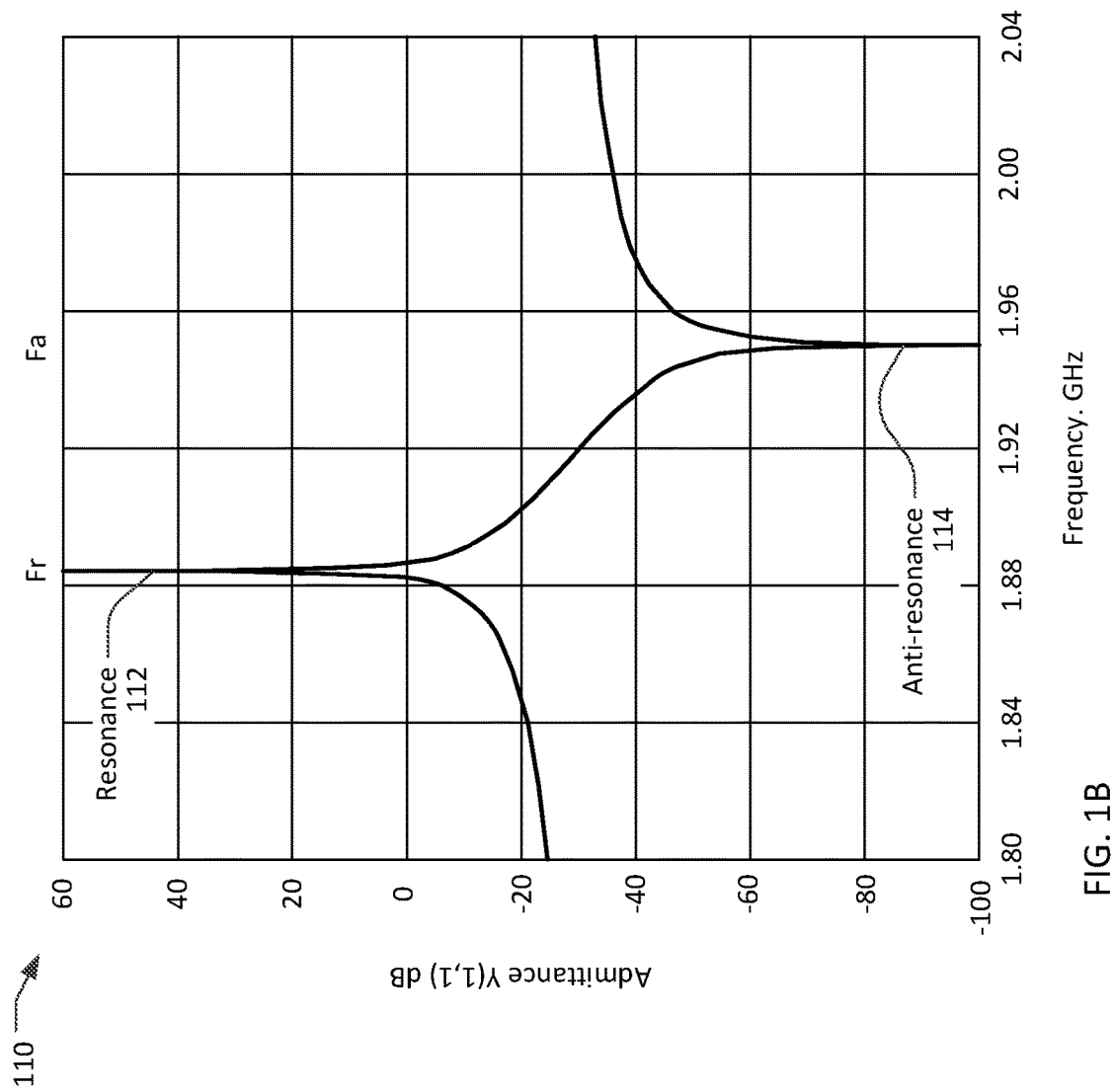
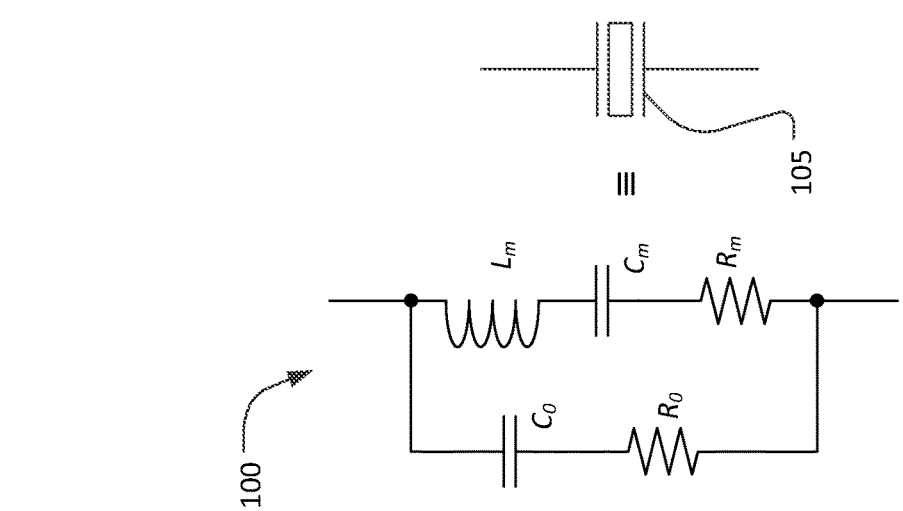
FIG. 1B
PRIOR ART
FIG. 1A
PRIOR ART

BANDPASS FILTER WITH IMPROVED UPPER BAND EDGE SHARPNESS

RELATED APPLICATION INFORMATION

This patent claims priority from the provisional patent application 62/773,884, filed Nov. 30, 2018, entitled BANDPASS FILTER WITH IMPROVED UPPER BAND EDGE SHARPNESS

NOTICE OF COPYRIGHTS AND TRADE DRESS

A portion of the disclosure of this patent document contains material which is subject to copyright protection. This patent document may show and/or describe matter which is or may become trade dress of the owner. The copyright and trade dress owner has no objection to the facsimile reproduction by anyone of the patent disclosure as it appears in the Patent and Trademark Office patent files or records, but otherwise reserves all copyright and trade dress rights whatsoever.

BACKGROUND

Field

This disclosure relates to radio frequency filters using acoustic wave resonators, and specifically to filters for use in communications equipment.

Description of the Related Art

A radio frequency (RF) filter is a two-port device configured to pass some frequencies and to stop other frequencies, where "pass" means transmit with relatively low insertion loss and "stop" means block or substantially attenuate. The range of frequencies passed by a filter is referred to as the "passband" of the filter. The range of frequencies stopped by such a filter is referred to as the "stop-band" of the filter. A typical RF filter has at least one passband and at least one stop-band. Specific requirements on a passband or stop-band depend on the specific application. For example, a "passband" may be defined as a frequency range where the insertion loss of a filter is less than a defined value such as one dB, two dB, or three dB. A "stop-band" may be defined as a frequency range where the insertion loss of a filter is greater than a defined value such as twenty dB, twenty-five dB, forty dB, or greater depending on application.

In this patent, the term "lower band limit" means the lowest frequency within the defined passband of a filter. The term "lower band edge" means the transition from high transmission to low transmission in the frequency range outside of the passband adjacent to the lower band limit. The term "higher band limit" means the highest frequency within the defined passband of a filter. The term "higher band edge" means the transition from high transmission to low transmission in the frequency range outside of the passband adjacent to the higher band limit.

RF filters are used in communications systems where information is transmitted over wireless links. For example, RF filters may be found in the RF front-ends of base stations, mobile telephone and computing devices, satellite transceivers and ground stations, IoT (Internet of Things) devices, laptop computers and tablets, fixed point radio links, and other communications systems. RF filters are also used in radar and electronic and information warfare systems.

RF filters typically require many design trade-offs to achieve, for each specific application, the best compromise between performance parameters such as insertion loss, rejection, isolation, power handling, linearity, size and cost. Specific design and manufacturing methods and enhancements can benefit simultaneously one or several of these requirements.

Performance enhancements to the RF filters in a wireless system can have broad impact to system performance. Improvements in RF filters can be leveraged to provide system performance improvements such as larger cell size, longer battery life, higher data rates, greater network capacity, lower cost, enhanced security, higher reliability, less noise, less distortion, less interference, etc. These improvements can be realized at many levels of the wireless system both separately and in combination, for example at the RF module, RF transceiver, mobile or fixed sub-system, or network levels.

DESCRIPTION OF THE DRAWINGS

FIG. 1A is a commonly used equivalent circuit of an acoustic wave resonator that exhibits both a resonance and an anti-resonance.

FIG. 1B is graph of the admittance of a lossless acoustic wave resonator modeled using the equivalent circuit of FIG. 1A.

Figure 2:
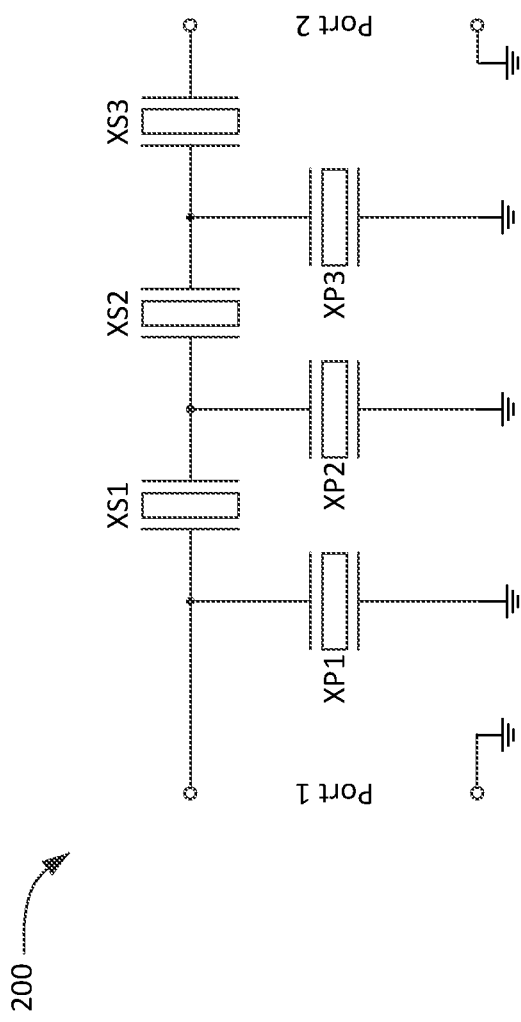
FIG. 2 is a schematic diagram of an exemplary ladder filter circuit comprising acoustic wave resonators modeled using the equivalent circuit of FIG. 1A.

Throughout this description, elements appearing in figures are assigned three-digit reference designators, where the two least significant digits are specific to the element and the one or two most significant digit is the figure number where the element is first introduced. An element that is not described in conjunction with a figure may be presumed to have the same characteristics and function as a previously-described element having the same reference designator.

DETAILED DESCRIPTION

Description of Apparatus

Acoustic wave resonators, such as surface acoustic wave resonators (SAWs), bulk acoustic wave (BAW) resonators, and film bulk acoustic wave (FBAW) resonators, are commonly used in radio frequency filters for communications devices. The admittance between the input and output terminals of an acoustic wave resonator is highly frequency dependent. Acoustic wave resonators and some other mechanical resonators exhibit both a motional resonance where the admittance of the resonator is very high and an anti-resonance where the admittance of the resonator is very low. The basic behavior of acoustic wave resonators is commonly described using the Butterworth Van Dyke (BVD) circuit model 100 as shown in FIG. 1A. The BVD circuit model 100 consists of a motional arm and a static arm. The motional arm includes a motional inductance $L_m$, a motional capacitance $C_m$, and a motional resistance $R_m$. The static arm includes a static capacitance $C_0$ and a static resistance $R_0$. While the BVD circuit model 100 does not fully describe the behavior of an acoustic resonator, it does a good job of modeling the two primary resonances that are used to design band-pass filters, duplexers, and multiplexers (multiplexers are filters with more than 2 input or output ports and with multiple passbands).

The first primary resonance of the BVD model is the motional resonance modeled by the series combination of the motional inductance $L_m$, the motional capacitance $C_m$, and the motional resistance $R_m$. The second primary resonance of the BVD circuit model 100 is the anti-resonance modeled by the series combination of the motional inductance $L_m$, the motional capacitance $C_m$, and the motional resistance $R_m$ in parallel with the series combination of the static capacitance $C_0$ and the static resistance $R_0$. In a lossless resonator ($R_m=R_0=0$), the frequency $F_r$ of the motional resonance is given by $$F_r = \frac{1}{2\pi\sqrt{L_m C_m}} \qquad (1)$$

The frequency $F_a$ of the anti-resonance is given by $$F_a = F_r\sqrt{1 + \frac{1}{\gamma}} \qquad (2)$$

where $\gamma = C_0/C_m$ is a characteristic of the substrate upon which the SAW resonator is fabricated. $\gamma$ is dependent on both the material and the orientation of the crystalline axes of the substrate, as well as the physical design of the resonator.

In subsequent figures, each resonator will be represented by the symbol 105 and modeled using the equivalent circuit 100.

FIG. 1B is a plot of the magnitude of the admittance of a theoretical lossless (i.e. $R_0=Rm=0$) acoustic resonator represented by a BVD model. The admittance exhibits a motional resonance 112 where the admittance of the resonator approaches infinity, and an anti-resonance 114 where the admittance of the resonator approaches zero. In oversimplified terms, the lossless acoustic resonator can be considered a short circuit at the frequency $F_r$ of the motional resonance 112 and an open circuit at the frequency $F_a$ of the anti-resonance 114. The frequencies of the motional resonance 112 and the anti-resonance 114 are representative, and a resonator may be designed for other resonant and anti-resonant frequencies.

FIG. 2 shows a simplified schematic circuit diagram of an exemplary band-pass filter circuit 200 comprising six acoustic wave resonators, labeled XS1 through XP3, connected in what is commonly termed a "ladder" circuit. The filter circuit 200 may be, for example, a transmit filter or a receive filter for incorporation into a communications device. The filter circuit 200 includes three series resonators (XS1, XS2, and XS3) connecting a first port (Port 1) and second port (Port 2). By definition, series resonators are connected in series to form an unbroken signal path from the first port to the second port. Either port may be the input or the output of the filter circuit. The filter circuit 200 includes three shunt resonators (XP1, XP2, and XP3). By definition, a shunt resonator is connected between ground and one of a junction of adjacent series resonators, an input of a filter, and an output of the filter. The schematic diagram of FIG. 2 is simplified in that passive components, such as the inductances inherent in the conductors interconnecting the resonators, are not shown. The use of six acoustic wave resonators, three series resonators, and three shunt resonators, is exemplary. A band-pass filter circuit using acoustic wave resonators may include more than, or fewer than, six resonators and more than, or fewer than, three series resonators and three shunt resonators, and need not have a "ladder" configuration.

Each acoustic wave resonator XS1 to XP3 may be a bulk acoustic wave (BAW) resonator, a film bulk acoustic wave (FBAW) resonator, a surface acoustic wave (SAW) resonator, a temperature compensated surface acoustic wave resonator (TC-SAW), a transversely-excited film bulk acoustic resonator (XBAR) as described in application Ser. No. 16/230,443, a solidly-mounted transversely-excited film bulk acoustic resonator (SM-XBAR) as described in application Ser. No. 16/438,141, or some other type of mechanical or acoustic wave resonator. All of the acoustic wave resonators XS1 to XP3 are typically, but not necessarily, the same type of resonator.

As shown in FIG. 1B, each acoustic wave resonator XS1 to XP3 exhibits very high admittance at a respective resonance frequency and very low admittance at a respective anti-resonance frequency higher than the resonance frequency. In simplified terms, each resonator may be considered a short circuit at its resonance frequency and an open circuit at its anti-resonance frequency. Thus, the transmission between Port 1 and Port 2 of the band-pass filter circuit 200 is very low at the resonance frequencies of the shunt resonators XP1, XP2, XP3 and the anti-resonance frequencies of the series resonators XS1, XS2, XS3. In a typical ladder band-pass filter, the resonance frequencies of shunt resonators are less than a lower limit of the filter passband to create a stop-band at frequencies below the passband. The anti-resonance frequencies of shunt resonators typically fall within the passband of the filter. Conversely, the anti-resonance frequencies of series resonators are greater than an upper limit of the passband to create a stop-band at frequencies above the passband. The resonance frequencies of series resonators typically fall with the passband of the filter.

In a typical ladder band-pass filter, the sharpness, or rate of change of transmission, of the upper edge of the passband is determined by the Q-factor and other characteristics of the series resonators near their anti-resonance frequencies. Some filter applications may require a very sharp upper passband edge, which is to say a transition from high transmission within the passband to high attenuation within a small frequency range proximate the upper limit of the passband. For some of these applications, the required upper band edge sharpness cannot be satisfied using a conventional acoustic wave resonator ladder filter circuit, as shown in FIG. 2.

Figure 3C:
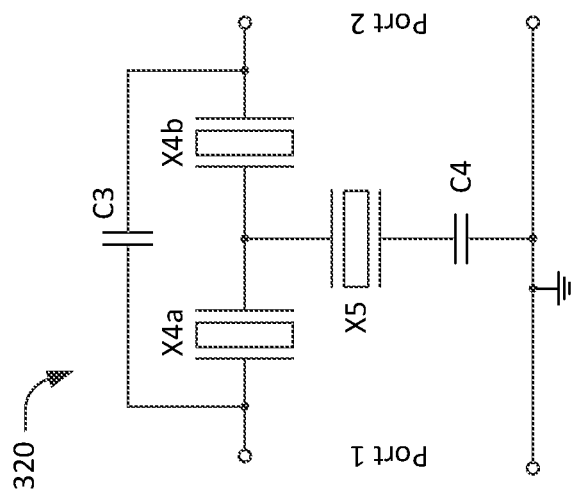
FIG. 3C is a schematic diagram of another two-port network including a bridged-T circuit.
Figure 3B:
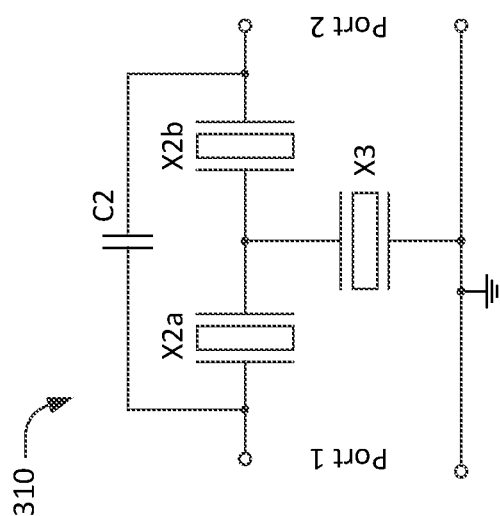
FIG. 3B is a schematic diagram of a two-port network including a bridged-T circuit.
Figure 3A:
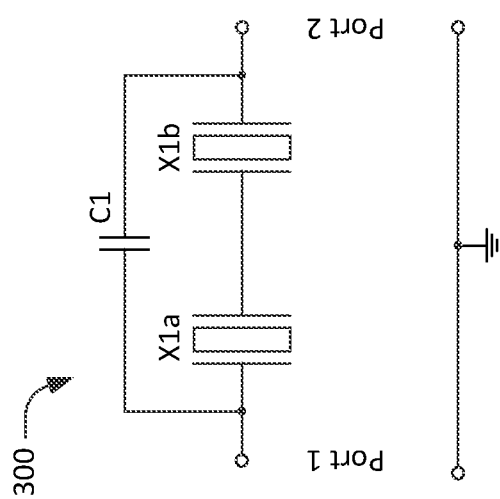
FIG. 3A is a schematic diagram of a two-port network including acoustic resonators modeled using the equivalent circuit of FIG. 1A.

FIG. 3A, FIG. 3B, and FIG. 3C are schematic circuit diagrams of two-port networks (300, 310, 320 respectively) that can be used as a series element in a ladder bandpass filter to significantly improve upper band edge sharpness.

The two-port network 300 of FIG. 3A consists of a pair of identical acoustic wave resonators X1a, X1b connected in series between a first port and a second port, and a capacitor C1 also connected between the first and second ports. The capacitor C1 "bridges" resonators X1a and X1b, which is to say the capacitor C1 provides an alternative signal path in parallel with the series combination of X1a and X1b. Typically, X1a and X1b will be electrically identical, which is to say the resonators have at least the same resonance frequency, anti-resonance frequency, and static capacitance.

The two-port network 310 of FIG. 3B comprises electrically identical acoustic wave resonators X2a and X2b connected in series between a first port and a second port, shunt acoustic wave resonator X3 connected from a junction between X2a and X2b and ground, and capacitor C2 connected between the first and second ports. Resonators X2a, X2b, and X3 are connected in the shape of a "T", and capacitor C2 "bridges" resonators X2a and X2b. This general circuit topology may be termed a "bridged-T" circuit.

The two-port network 320 of FIG. 3C is another bridged-T circuit similar to the two-port network 310 of FIG. 3B with the addition of capacitor C4 in series with resonator X5 in the vertical leg of the "T". Resonators X4a and X4b and capacitor C3 are connected similarly to the counterpart components in the two-port network 310.

Acoustic wave resonators X1a, X1b, X2a, X2b, X3, X4a, X4b, and X5 may be SAW resonators, BAW resonators, FBARs, XBARs or some other acoustic wave resonator technology that can be modeled using the BVD circuit model 100 shown in FIG. 1A. Within each two-port network 300, 310, 320, all of the resonators typically use the same technology.

Figure 4:
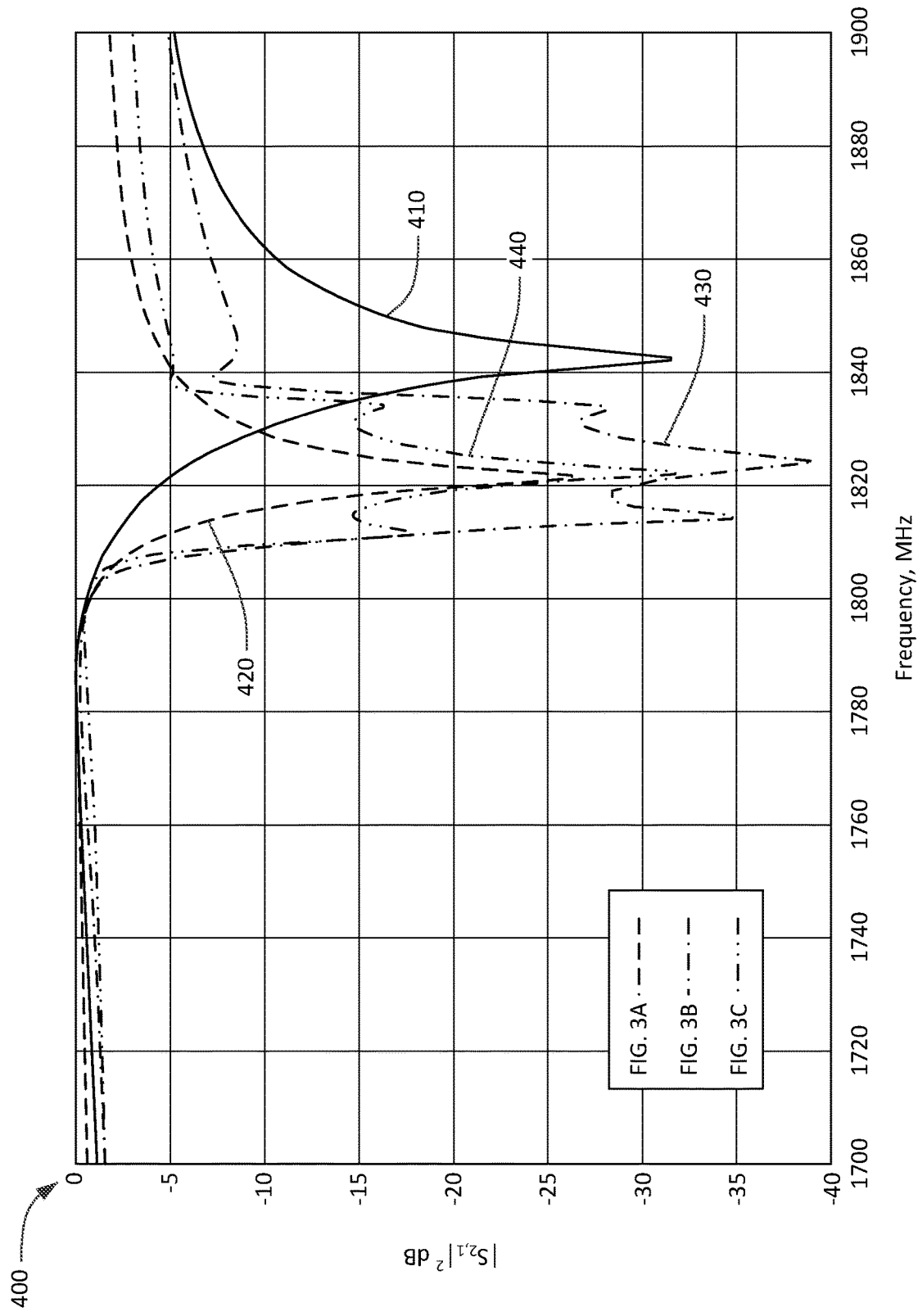
FIG. 4 is a graph of the transmission through the two-port networks of FIG. 3A, FIG. 3B, and FIG. 3C.

FIG. 4 is a chart 400 of the transmission through exemplary embodiments of the two-port networks of FIG. 3A, FIG. 3B, and FIG. 3C. The transmission through each two-port network was determined by circuit simulation under the conditions that the first port (Port 1) is connected to a source with a 50-ohm source impedance and the second port (Port 2) is terminated with a 50-ohm load impedance. For all resonators, the assumed value of γ (defined in paragraph 0023 above) was 14, the assumed value of Qm (Q-factor of the motional resonance) was 1200, and the assumed value of QC0 (Q-factor of the static capacitance) is one-tenth of Qm. These assumed values are approximately representative of lithium tantalate SAW resonators. The chart 400 includes a plot of the transmission through each two-port network, expressed in dB, as a function of frequency.

In the chart 400, the solid line 410 is a plot of $|S_{2,1}|^2$, which is the transmission through a two-port network, for a network (not shown) consisting of a single series resonator with the following component values:
Fr=1785 MHz
C0=1 pF
where Fr is the motional resonance frequency and $C_0$ is the static capacitance of the resonator. The single resonator has a resonance frequency of 1785 MHz (where the transmission through the two-port network is maximum) and an anti-resonance frequency (where the transmission through the two port network is minimum) of about 1847 MHz.

In the chart 400, the dashed line 420 is a plot of transmission for an exemplary embodiment of the two-port network 300 of FIG. 3A with the following component values:
X1a, X1b Fr=1785 MHz
C0=2 pF
C1 0.62 pF.

As can be seen by comparing the solid line 410 and the dashed line 420, the effect of a capacitor bridging one or more series resonators is to lower the anti-resonance frequency without substantially changing the resonance frequency. In this example, the anti-resonance frequency is reduced from about 1847 MHz to about 1822 MHz.

The dot-dash line 430 is a plot of transmission for an exemplary embodiment of the two-port network 310 of FIG. 3B with the following component values:
X2a, X2b Fr=1774 MHz
C0=1.9 pF
C2 0.04 pF
X3 Fr 32 1813 MHz
C0=0.3 pF.

The resonance frequency of the resonator X3 in the vertical leg of the "T" is higher than the resonance frequency of the resonators X2a, X2b in the horizontal arms of the "T".

As can be seen by comparing the dot-dash line 430 with the solid line 410 and the dashed line 420, the effect of the bridge-T circuit is to significantly sharpen (i.e. make more vertical as plotted in FIG. 4) the transition from high transmission to low transmission for frequencies above 1800 MHz. In this example the transmission changes from −1 dB at 1800 MHz to less than −27 dB-within a frequency span of about 15 MHz.

The dot-dot-dashed line 440 is a plot of transmission for an exemplary embodiment of the two-port network 320 of FIG. 3C with the following component values:
X4a, X4b Fr=1785 MHz
C0=2 pF
C3 0.62 pF
X5 Fr=1764 MHz
C0=4 pF
C4 1 pF.

The resonant frequency of the resonator X5 in the vertical leg of the "T" is lower than the resonant frequency of the resonators X2a, X2b in the horizontal arms of the "T". The resonant frequency of the series combination of capacitor C3 and resonator X5 is higher than the resonance frequency of the resonator in isolation. Capacitor C3 may be configured such that the resonance frequency of the series combination of capacitor C3 and resonator X5 is higher than the resonance frequency of series resonators X4a, X4b.

As can be seen by comparing the dot-dot-dash line 440 with the solid line 410 and the dot-dash line 430, the two-port network 320 has a sharper transition from high transmission to low transmission for frequencies above 1800 MHz than the two-port network 310, but does not have the depth of rejection provided by the two-port network 310.

Figure 5:
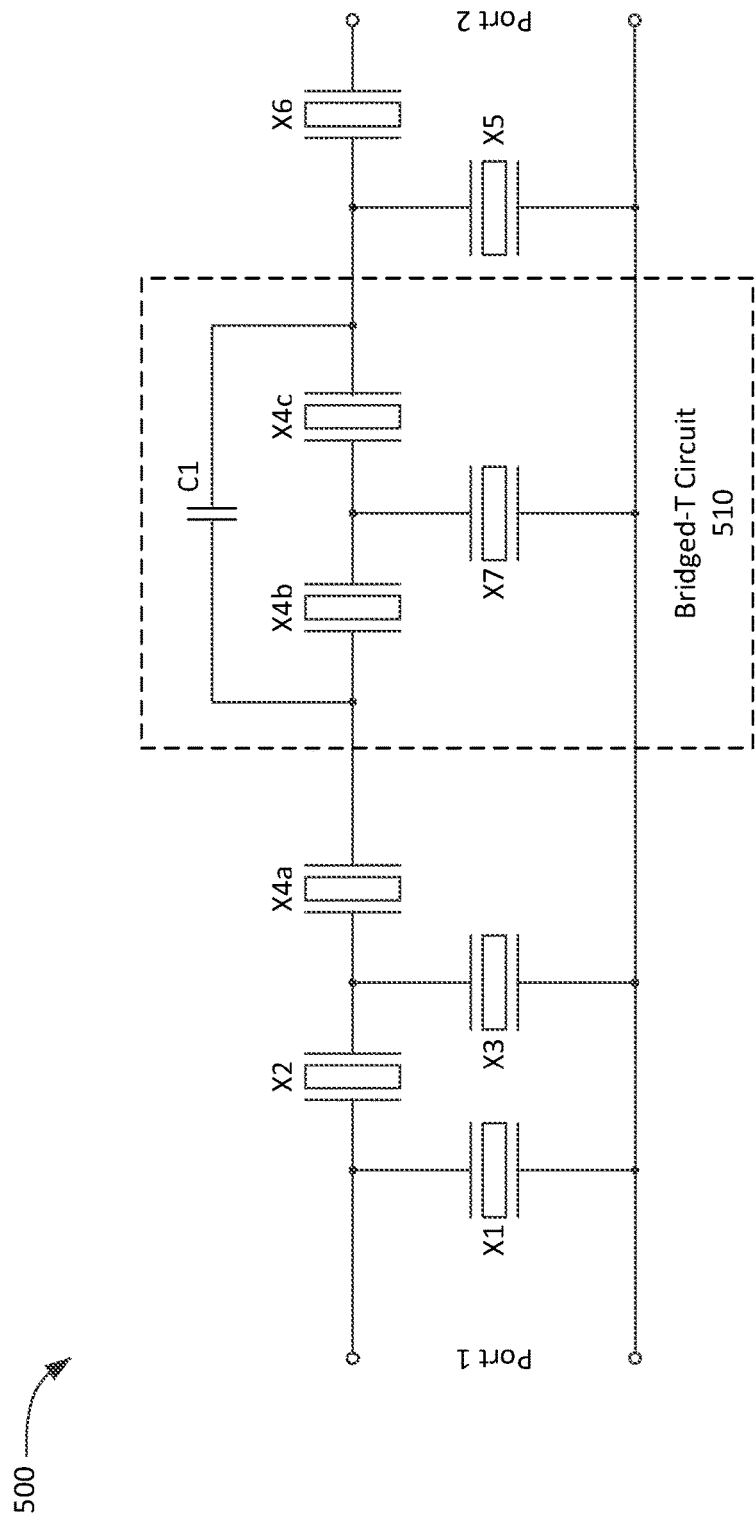
FIG. 5 is a simplified schematic diagram of an exemplary band-pass filter circuit incorporating a bridged-T circuit.

FIG. 5 shows a simplified schematic circuit diagram of an exemplary band-pass ladder filter circuit 500 with improved upper band edge sharpness. The schematic diagram of FIG. 5 is simplified in that some passive components, such as the inductances inherent in the conductors interconnecting the resonators, are not shown. The filter circuit 500 includes a bridged T circuit 510 similar to the bridged T circuit 310 of FIG. 3B. The filter circuit 500 is similar to the filter circuit 200 of FIG. 2 with series resonator X4 divided into three series resonators X4a, X4b, and X4c connected in series. X4b and X4c are incorporated, along with shunt resonator X7 and capacitor C1, in the bridged T circuit 510. A resonance frequency of shunt resonator X7 may be greater than the resonance frequency of series resonators X4b and X4c. A resonance frequency of shunt resonator X7 may be greater than, and proximate to, an upper limit of the filter passband.

The filter circuit 500 is exemplary. A bridged-T circuit such as the bridge-T circuit 510 may be incorporated into ladder filters that have more or fewer resonators and/or are designed for other frequency ranges. In the filter circuit 500, the bridged-T circuit 510 is basically substituted for a portion of series resonator XS2 in the filter circuit 200. In other filters, a bridged-T circuit may be substituted for any series resonator.

Figure 6:
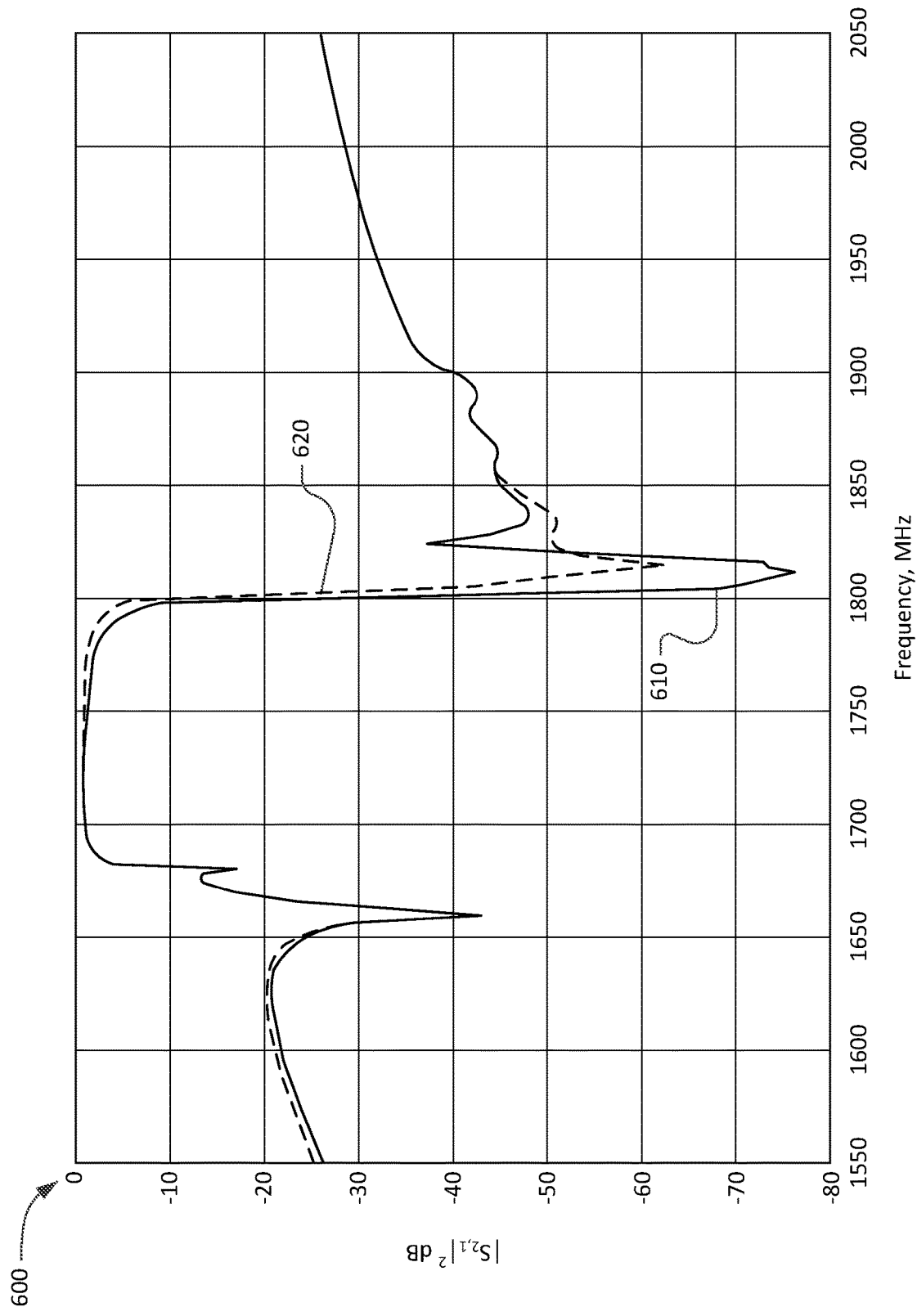
FIG. 6 is a graph of the transmission through exemplary embodiments of the band pass filter circuits of FIG. 2 and FIG. 5.

FIG. 6 is a graph 600 illustrating the improvement in upper band edge sharpness provided by incorporation of a bridged-T circuit in a ladder bandpass filter. The solid line 610 is a plot of S(1,2) for an embodiment of the filter circuit 500 including a bridged-T circuit. The dashed line 620 is a plot of $|S_{2,1}|^2$ for an embodiment of the filter circuit 200 of FIG. 2. Both embodiments are LTE (Long Term Evolution) Band 3 transmit filters for incorporation into a Band 3 duplexer for use in a portable communications device. A requirement for both filters is to provide high transmission at the upper edge of the transmit band at 1785 MHz and very low transmission at the lower edge of the receive band at 1805 MHz. Comparison of the solid line 610 and the dashed line 620 shows that the filter circuit 500 with the bridge-T circuit provided substantially improved upper band edge sharpness.

Closing Comments

Throughout this description, the embodiments and examples shown should be considered as exemplars, rather than limitations on the apparatus and procedures disclosed or claimed. Although many of the examples presented herein involve specific combinations of method acts or system elements, it should be understood that those acts and those elements may be combined in other ways to accomplish the same objectives. With regard to flowcharts, additional and fewer steps may be taken, and the steps as shown may be combined or further refined to achieve the methods described herein. Acts, elements and features discussed only in connection with one embodiment are not intended to be excluded from a similar role in other embodiments.

As used herein, "plurality" means a finite number greater than or equal to two. As used herein, a "set" of items may include one or more of such items. As used herein, whether in the written description or the claims, the terms "comprising", "including", "carrying", "having", "containing", "involving", and the like are to be understood to be open-ended, i.e., to mean including but not limited to. Only the transitional phrases "consisting of" and "consisting essentially of", respectively, are closed or semi-closed transitional phrases with respect to claims. Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements. As used herein, "and/or" means that the listed items are alternatives, but the alternatives also include any combination of the listed items.

It is claimed:

1. A bandpass filter comprising:
   a plurality of series resonators connected in series between a first port and a second port, the plurality of series resonators including a first series resonator and a second series resonator connected at a node;
   a plurality of shunt resonators including a first shunt resonator coupled between the node and a ground;
   a second capacitor connected in series with the first shunt resonator; and
   a capacitor bridging the first and second series resonators, wherein a resonance frequency of the first shunt resonator, in isolation, is lower than an upper limit of a passband of the bandpass filter, and wherein a capacitance of the second capacitor is configured such that a series combination of the first shunt resonator and the second capacitor has a resonance frequency greater than the upper limit of the passband.

2. The bandpass filter of claim 1, wherein the first and second series resonators are electrically identical.

3. The bandpass filter of claim 1, wherein a resonance frequency of the first shunt resonator is greater than a resonance frequency of the first and second series resonators.

4. The bandpass filter of claim 3, wherein the resonance frequency of the first shunt resonator is proximate the upper limit of the passband.

5. The bandpass filter of claim 1, wherein the plurality of series resonators includes at least a third series resonator, and the plurality of shunt resonators includes at least three shunt resonators.

6. A bandpass filter comprising:
   a plurality of series resonators connected in series between a first port and a second port, the plurality of series resonators including a first series resonator and a second series resonator connected at a node;
   a capacitor bridging the first and second series resonators; and
   a series combination of a first shunt resonator and second capacitor coupled between the node and a ground, wherein
   a resonance frequency of the first shunt resonator, in isolation, is lower than an upper limit of the passband, and
   a capacitance of the second capacitor is configured such that a series combination of the first shunt resonator and the second capacitor has a resonance frequency greater than the upper limit of the passband.

7. The bandpass filter of claim 6, wherein the plurality of series resonators includes at least a third series resonator.

8. The bandpass filter of claim 6, further comprising:
   at least a second shunt resonator.

\* \* \* \* \*